United States Patent [19]
Ding et al.

[11] Patent Number: 5,736,021
[45] Date of Patent: Apr. 7, 1998

[54] ELECTRICALLY FLOATING SHIELD IN A PLASMA REACTOR

[75] Inventors: Peijun Ding, San Jose; Zheng Xu, Foster City; Jianming Fu, San Jose, all of Calif.

[73] Assignee: Applied Materials, Inc., Santa Clara, Calif.

[21] Appl. No.: 677,760

[22] Filed: Jul. 10, 1996

[51] Int. Cl.[6] .................................................. C23C 14/34
[52] U.S. Cl. .......................... 204/298.11; 204/192.12; 204/298.06; 204/298.08; 204/298.14
[58] Field of Search .................... 204/298.11, 192.12, 204/298.06, 298.08, 298.14

[56] References Cited

U.S. PATENT DOCUMENTS

| | | | |
|---|---|---|---|
| 4,132,613 | 1/1979 | Penfold et al. | 204/298.21 X |
| 4,169,031 | 9/1979 | Brors | 204/298.09 X |
| 4,362,611 | 12/1982 | Logan et al. | 204/298.06 |
| 4,897,172 | 1/1990 | Katsura et al. | 204/298.11 X |
| 5,135,634 | 8/1992 | Clarke | 204/298.06 |
| 5,215,638 | 6/1993 | Hausler | 204/298.11 X |
| 5,228,968 | 7/1993 | Zejda | 204/298.11 X |
| 5,294,320 | 3/1994 | Somekh et al. | 204/298.11 |
| 5,334,298 | 8/1994 | Gegenwart | 204/192.12 |
| 5,419,029 | 5/1995 | Raaijmakers | 204/298.11 X |
| 5,470,451 | 11/1995 | Kobayashi et al. | 204/298.11 X |
| 5,527,439 | 6/1996 | Sieck et al. | 204/298.11 X |
| 5,538,603 | 7/1996 | Guo | 204/298.11 X |

FOREIGN PATENT DOCUMENTS

| | | | |
|---|---|---|---|
| 40-4013868 | 1/1992 | Japan | 204/298.11 |

*Primary Examiner*—Nam Nguyen
*Attorney, Agent, or Firm*—Donald E. Verplancken; Charles S. Guenzer

[57] ABSTRACT

In a plasma reactor, especially one intended for physical vapor deposition (PVD) onto semiconductor substrates, a shield disposed in front of the chamber walls between the PVD target and the substrates to protect the chamber walls. According to the invention, the shield is left electrically floating so that electrically charged ions and electrons emanating from the plasma or target and impinging upon the shield charge it to the point that the electrical flux is repelled.

20 Claims, 2 Drawing Sheets

ELECTRICALLY FLOATING SHIELD IN A PLASMA REACTOR

FIELD OF THE INVENTION

The invention generally plasma reactors. In particular, the invention relates to a shield for protecting the walls of the reactor chamber.

BACKGROUND ART

In modern fabrication of semiconductor integrated circuits, metals are typically deposited by physical vapor deposition (PVD) utilizing a plasma reactor. This deposition process is performed in a plasma reactor 10 illustrated in schematic cross section in FIG. 1. This reactor 10 is similar to that disclosed by Somekh et al. in U.S. Pat. No. 5,294,320. It includes a PVD target 12, which in conjunction with a chamber wall 14 and other sealing members, forms a vacuum chamber. The PVD target 12 is composed, for at least the portion facing the central portion of the vacuum chamber, of the material to be sputtered, for example, aluminum. A substrate 16 whose surface is to be sputter deposited is supported on a pedestal 18 positioned in opposition to the target 12. A gas supply system 20 supplies a controlled flow of various gases into the vacuum chamber while a vacuum pump 21 maintains a vacuum level at a fixed gas flow. The vacuum chamber is filled with non-reactive argon to a reduced pressure. Note however that in some applications a reactive gas is additionally filled into the chamber to effect reactive sputtering. The conductive chamber wall 14, usually made of aluminum or stainless steel, is generally grounded while a DC power supply 24 applies a negative voltage of about −500V to the target 12. An insulating ring 26 between the target 12 and the chamber wall 14 allow their differential biasing. The electrical bias causes the argon to discharge and form a plasma of positively charged argon ions and negatively charged electrons in the space between the target 12 and the substrate 16. The argon ions are electrically attracted to the negatively charged target 12 and, strike it at high enough energy to sputter target particles from the target 12. The sputtered material travels ballistically, generally omni-directionally, and some fraction hit the substrate 16 to be deposited thereon as a thin film. The pedestal 18 and thus the substrate 16 is usually left electrically electrically floating, although in some situations it is RF biased.

However, in the structure described to this point, a sizable fraction also would hit the chamber walls 14 to deposit a thin film thereon. The film thickness progressively increases as more substrates 16 are processed until it becomes thick enough that it tends to flake off, creating particles in a chamber that needs to be ultra-clean. Although the chamber wall 14 can be periodically cleaned, the cleaning is time consuming, thus costing both system downtime and operator time.

The favored solution, instead, places a generally cylindrical shield 22 within the plasma reactor 10 to intersect any direct path between the target 12 and the chamber wall 14. The shield 22 is generally electrically grounded, usually by physical attachment to the chamber wall 14. Thereby, sputter particles travelling toward the chamber wall 14 are intercepted by the shield 22 and deposit thereupon. The shield 22 eventually builds up a thick layer of the sputtered material. However, the shield 22 is not cleaned in situ but instead is designed to be easily and quickly removed and replaced by a fresh shield 22. The shields may be discarded, or they may be cleaned off line, perhaps by immersion in a cleaning solution, and thereafter reused. In any case, the use of shields significantly reduces the expense of reconditioning the reactor 10 to reduce the particle count.

One of the more challenging applications of PVD is to fill narrow holes formed in the substrate, for example, an inter-level via or a contact through a dielectric layer to the underlying silicon. The width of these apertures is being pushed below 0.25 μm, and their aspect ratio, that is, the ratio of their depth to their height, is being pushed to above 5. With such a high aspect ratio, it is difficult to fill the hole before non-perpendicular particle flux collecting on the rim of the hole closes off the hole and leaves a void within the hole. That is, bottom coverage become difficult with high aspect-ratio holes. It is now known that gas collisions reduce bottom coverage, presumably because the mean free path of target atoms is approximately equal to the chamber dimensions at typical operating pressures and at somewhat higher pressures the resultant collisions randomize the sputter particles trajectories or lessen their energy.

As a result, the pressure within the sputtering reactor 10 should be reduced to reduce the gas collisions. However, the conventional design shown in FIG. 1 limits the pressure to be above approximately 1.5 milliTorr. Below this pressure, the plasma collapses. We believe that the effect is due to the conventional shield 22 readily collecting electrons from the vicinity of the target 12.

A plasma discharge is maintained by a chain reaction between electrons and neutral argon of the form

$$e^- + Ar \rightarrow Ar^+ + e^- + e^-.$$

The positively charged argon is attracted to the target, but the additionally generated electron is enough to sustain the discharge if the electron loss via several mechanisms is not too large. At lower pressures, the electrons are more likely to diffuse or be attracted to the shield 22 or other chamber components before they strike another neutral argon to sustain the reaction. Thus, if the electrons are excessively grounded through the shield 22, the reaction is not self-sustaining, and the plasma collapses.

Somekh et al. in the previously cited patent selectively apply different voltages to the shield, but this is done during a shield cleaning operation. Clarke in U.S. Pat. No. 5,135, 634 discusses a shield, but it appears to serve a different purpose in a significantly different geometry than the shield of the present invention. Nonetheless, he discusses positively biasing his shield to attract electrons and to funnel positive ions towards the wafer.

Gegenwart in U.S. Pat. No. 5,334,298 discloses an electrically floating dark-space shield. A dark-space shield is disposed generally even with and in back of the target to prevent components other than the target from being sputtered by the ionized argon atoms. It does not act as a protective shield interposed between the front of the target and the chamber walls.

Accordingly, it is desired to operate a plasma reactor, particularly a PVD reactor, at lower pressures. It is thus desired to improve the design of the protective shield so as to reduce its grounding effect of electrons. Nonetheless, the design must be simple.

SUMMARY OF THE INVENTION

The invention can be summarized as a protective shield in a plasma reactor that is electrically floating. Thereby, the shield collects some electrons from the plasma, but eventually charges sufficiently negative that it begins to repel any additional electrons. The shield can be formed in two parts, the part closer to the target being electrically floating while the part more distant from the target is grounded.

DETAILED DESCRIPTION OF THE PREFERRED EMBODIMENTS

Figure 1:
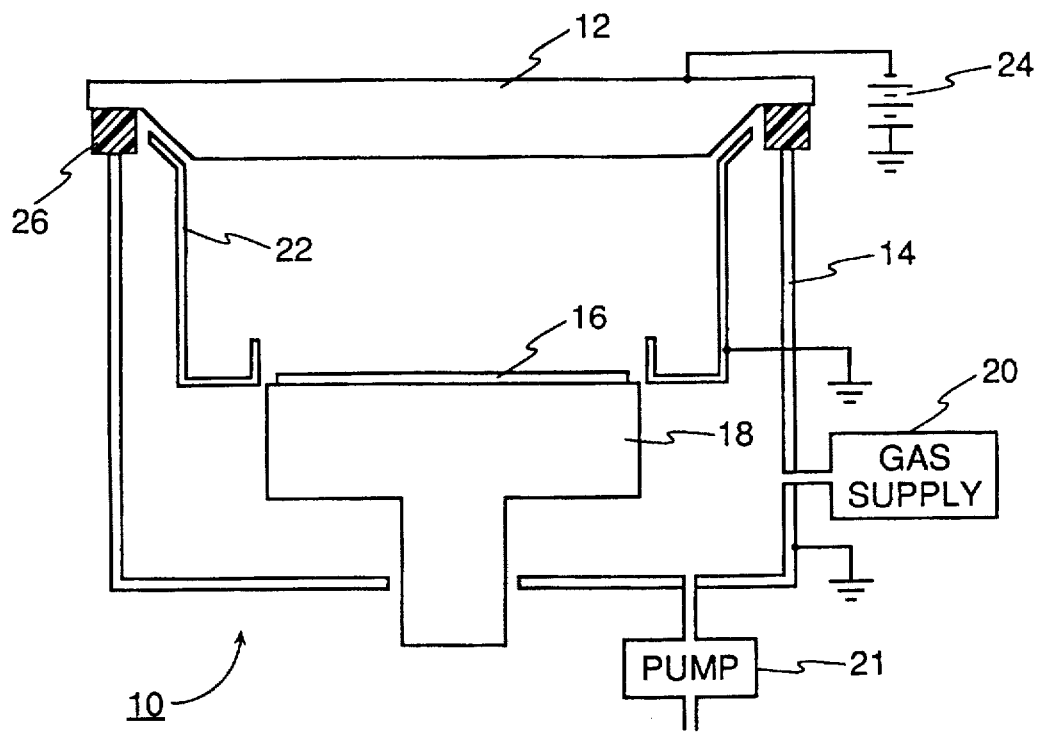
FIG. 1 is a schematical cross sectional view of a plasma reactor including a conventional shield.
Figure 2:
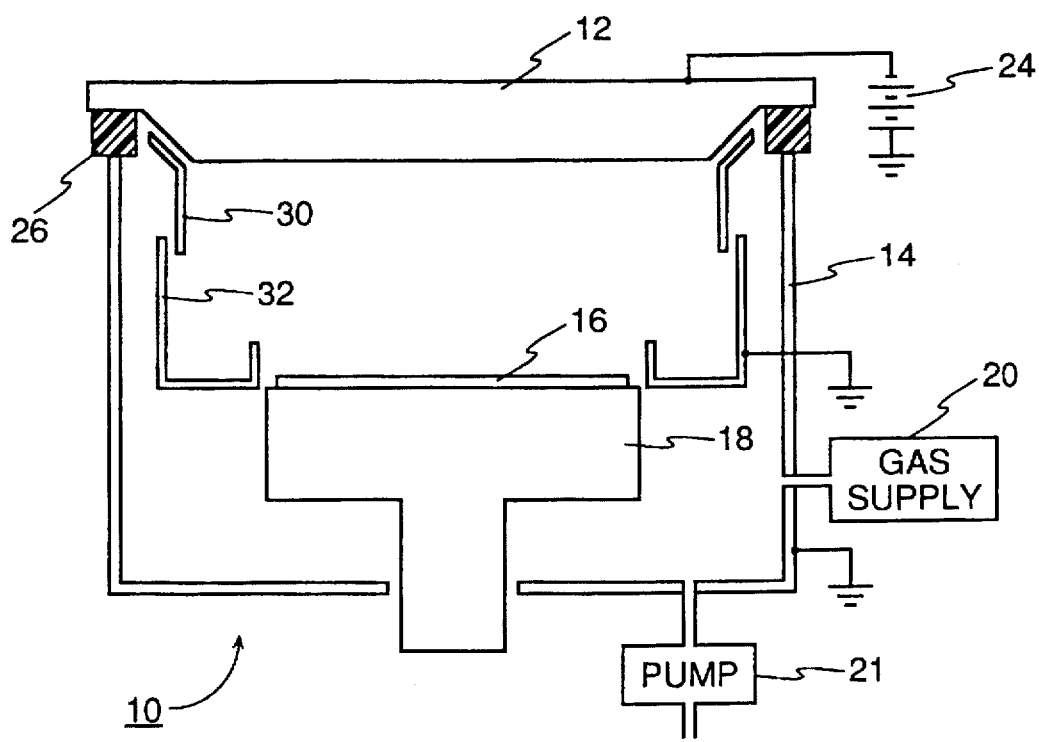
FIG. 2 is a schematical cross sectional view of a plasma reactor including a shield of the invention.

A PVD plasma reactor 10, illustrated in FIG. 2 incorporates one embodiment of the protective shield of the invention. A shield 30 adjacent to the target 12 is left electrically floating. Optionally, a second shield 32 closer to the substrate 16 is electrically grounded in the conventional fashion. The floating shield 30 either alone or in conjunction with the grounded shield 32 is interposed between the target 12 and most if not all of the chamber wall 14 so as to protect it from being sputter deposited. Preferably, the lower, grounded shield 32 has a larger diameter than the upper, floating shield 30, and the two shields 30, 32 axially overlap so as to produce a baffle structure.

During operation of the plasma reactor 10, the floating shield 30 is initially at zero potential and thus collects some electrons from the plasma. These electrons have no current path to flow away from the floating shield 30. As a result, the electrons collect on the floating shield 30, and it begins to develop a negative potential. As the negative potential increases in magnitude, the floating shield 30 begins to progressively more repel the electrons. At some point, equilibrium is reached, and no more electrons are extracted from the plasma to the floating shield 30. We have found that the floating shield 30 attains a steady state voltage of between about −20V to −120V dependent upon gas flow and target voltage.

The floating shield serves the same purpose as the conventional grounded shield in protecting the chamber walls from deposition. Once the floating shield has become coated with a dangerously thick layer of sputtered material, it can be removed and replaced by a fresh floating shield. The replacement is facilitated by the lack of electrical connections. Like the grounded shield, the floating shield can be cleaned and reused, or it can be considered to be a consumable.

Figure 3:
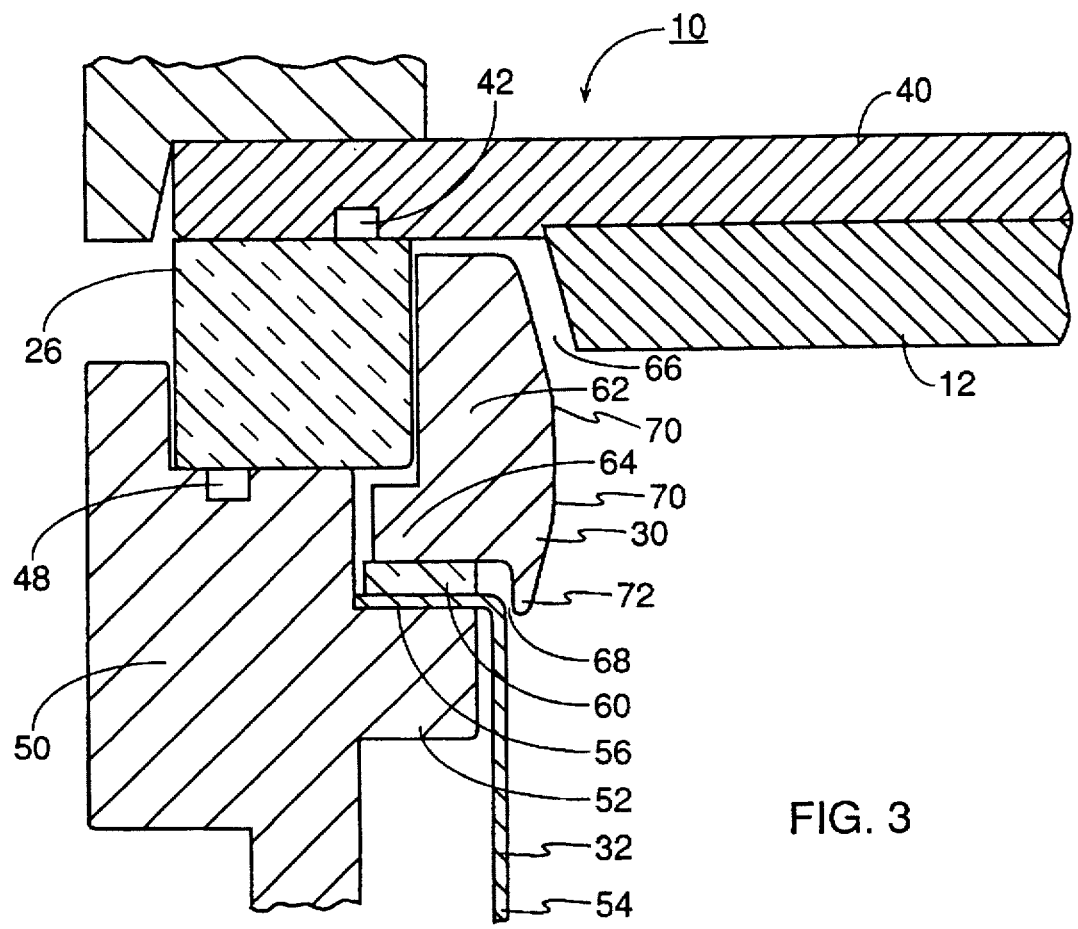
FIG. 3 is a detailed cross sectional view of a portion of a plasma reactor and an embodiment of the inventive shield.

A detailed cross sectional view of a portion of the PVD reactor 10 incorporating the inventive floating shield 30 is shown in FIG. 3. The PVD target 12 is fixed to a target backing plate 40, behind which are located unillustrated scanning magnets and the chamber cover. A first O-ring 42 establishes a vacuum seal between the target backing plate 40 and an insulator 26 while a second O-ring 48 maintains the vacuum seal between the insulator 26 and an adapter 50 forming part of the chamber wall 14. An annular ledge 52 extends radially inwardly into the vacuum chamber. The grounded shield 32 is usually formed of a metal such as aluminum or stainless steel and at its upper end has an outwardly extending rim 56 and a downwardly extending skirt 54. The rim 56 is supported on the ledge 52 of the wall adapter 50 and is electrically connected to it by unillustrated screws so as to be electrically grounded. The grounded shield 32 thus protects the wall adapter 50 and other parts of the lower chamber wall 14 from the PVD flux.

An annular insulating ceramic spacer 60 rests on top of the rim 56 of the grounded shield 32 and in turn supports the annular floating shield 30 formed of stainless steel. The floating shield 30 is sized so that no contact with the chamber insulator 26 is intended. However, the floating shield 30 has both an upper end 62 and a lower knob 64 resting on the ceramic spacer 60 which are sized so that, even if the upper end 62 comes into contact with the chamber insulator 26, the knob 64 still does not contact the wall adapter 50. The floating shield 30 and the ceramic spacer 60 do not establish a current path so that they can be gravitationally held rather than rigidly attached, but insulating affixing means can be used to rigidly establish the position of the floating shield 30. The upper end 62 of the floating shield extends upwardly to behind the front of the target 12 so as to protect the chamber insulator 26 from being sputter coated. A gap 66 is maintained between the floating shield 30 and the target 12 and its backing plate 40, and another gap 68 is maintained between the floating and grounded shields 30, 30. Thereby, the floating shield 30 is left electrically floating with no electrical conduction path to ground.

The floating shield 30 is shaped as a solid body with chamfered corners 70 in areas potentially exposed to the plasma so as to reduce the chance of arcing. It also includes a downwardly extending lip 72 that slightly axially overlaps the skirt 58 of the grounded shield 30 so as to protect the ceramic insulator 60.

Experiment

An experiment was performed to determine whether the floating shield is effective in reducing the minimum chamber pressure for which a plasma can be maintained. The target was aluminum alloyed with 1% silicon and 0.5% copper. The spacing between the target and the substrate was fixed at 160 mm, DC bias of −640V was applied to the target, and the resulting target current was 16 A. At an argon flow into the chamber of 11 sccm and using the inventive floating shield, an argon plasma was maintained. When the argon flow was reduced to 10 sccm, the plasma was extinguished. Pressure was measured at about 0.4 milliTorr for both flows on a baratron pressure guage, which provides poor resolution in this pressure range since it has a full scale of 100 milliTorr. For comparison, a metal spacer was substituted for the insulating ceramic spacer 60 so that the metal floating shield 30 of FIG. 3 was instead grounded to the adapter wall 50. In this comparison test, the argon plasma was maintained at an argon flow of 17 sccm but was extinguished at 16 sccm. The measured chamber pressure was between 0.5 and 0.6 milliTorr. Thus, the floating of the shield allowed the minimum chamber pressure supporting a plasma to be reduced by about 27% as measured by the insensitive pressure gauge or by 35% as measured indirectly by the more sensitive mass flow controller.

Figure 4:
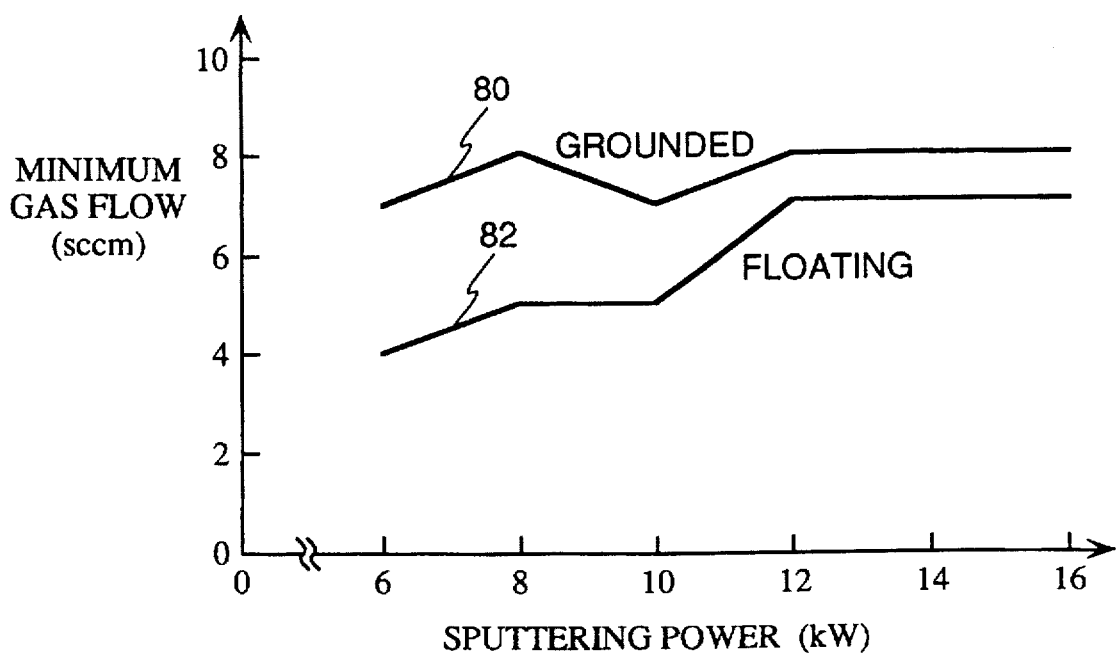
FIG. 4 is a graph showing minimum gas flows at which a plasma could be maintained with the shield grounded or floating.

A wider characterization is presented in FIG. 4. With the metal floating shield 30 either grounded or left electrically floating, the minimum gas flow was determined for which a plasma was maintained at a number of values of the sputtering power. Trace 80 shows the minimum gas flow for a grounded shield, and trace 82 shows it for an electrically floating shield. For all sputtering powers, a plasma could be maintained at a lower gas flow with a floating shield than with a grounded shield. It is assumed that the chamber pressures varied proportionately with the gas flow.

A further set of experiment was done to determine the effect of pressure upon bottom coverage in a 0.5 μm-wide hole having an aspect ratio of 2.5. As the chamber pressure was reduced from 1.7 milliTorr to 0.5 milliTorr, the bottom coverage improved from 15% to 23% when the spacing between the target and substrate was about 220 mm. The numerical value refers to the amount of material sputtered into the bottom of the hole compared to that deposited on a planar surface.

Thus, it is seen that the invention is effective at reducing the minimum pressure in a plasma reactor at which a plasma is maintained. As a result, the bottom coverage can be improved.

Although the invention is particularly applicable to PVD, a floating shield can be advantageously applied to other types of plasma reactors, including those used for etching and for chemical vapor deposition (CVD). In these other cases, the generation of the plasma can occur somewhat differently, for example, the bias of the electrodes may be reversed. Alternatively, the RF energy is inductively coupled into the plasma, or microwave energy is supplied from a remote microwave source, or the plasma is supplied from a remote plasma source.

The physical structure of the floating shield can be modified in several ways varying from that presented. Its lip can be extended into a skirt extending downwardly to the pedestal. That is, the grounded shield can be replaced by an extended floating shield. The floating shield can be made of other metals than stainless steel or of a ceramic having a metal coating on the surface facing the plasma. Indeed, the floating shield could be made entirely of an insulating ceramic since no conduction path to ground is required. However, a fully ceramic shield will collect different amounts of negative charge on its different portions so that a voltage distribution will develop.

Similar effects can be obtained by active biasing of the shield, specifically biasing the shield negative by a predetermined amount relative to the chamber wall and other parts. However, such active biasing requires an additional power supply and additional electrical connections including one penetrating the vacuum chamber. In contrast, the effective negative biasing of the floating shield is accomplished passively with no required electrical connections.

A floating shield thus is an inexpensive expedient in reducing the allowed chamber pressure, and thus in the case of PVD to provide better bottom coverage for high aspect ratio holes.

What is claimed is:

1. A PVD reactor, comprising:

a reactor chamber having at least one generally inwardly concave side wall;

a target having a generally planar surface comprising a target material disposed in said chamber;

a support disposed in said chamber capable of supporting a substrate in opposition to said target along a chamber axis, said at least one side wall of said chamber extending generally between said target and said support;

a DC electrical power source for electrically biasing said target at a negative biasing voltage to create a plasma in said chamber;

an electrically floating shield installed in said chamber and having a portion extending in a direction along said chamber axis between said plasma and said at least one wall to protect said wall from sputter deposition; and a second shield held at a predetermined potential higher than said negative biasing voltage and installed in said chamber between said electrically floating shield and said support to act as an anode with respect to said target.

2. The reactor of claim 1, wherein said electrically floating shield comprises a metallic member.

3. The reactor of claim 1, wherein said electrically floating shield comprises a ceramic member having a metallic coating.

4. The reactor of claim 1, wherein said electrically floating shield constitutes at least a part of a shield system protecting all of said at least one side wall.

5. The reactor of claim 1, wherein said predetermined potential is ground.

6. The reactor of claim 1, wherein both said electrically floating and said second shields have portions extending along said chamber axis.

7. The reactor of claim 6, wherein said second shield has a top portion and said electrically floating shield has a bottom portion overlapping said top portion of said second shield, said top and bottom portions being separated by a gap in a direction perpendicular to said chamber axis.

8. The reactor of claim 7, wherein said bottom portion of said electrically floating shield is inward of said top portion of said second shield.

9. The reactor of claim 8, further comprising an insulating member interposed between said electrically floating and said second shields that is shielded from said plasma by said bottom portion of said electrically floating shield.

10. The reactor of claim 1, wherein said second shield is supported on and electrically connected to said chamber and further comprising an insulating member resting on said second shield and supporting said electrically floating shield.

11. The reactor of claim 10, wherein said electrically floating shield includes a lip portion radially inward of said insulating member.

12. A PVD reactor, comprising:

a chamber wall;

a first electrically insulating member disposed on said wall;

a target assembly disposed on said first insulating member and including a substantially planar target facing downwardly toward a substrate holder;

a first shield member having a rim portion disposed on a radially inwardly extending ledge of said chamber wall and a skirt portion extending downwardly from said target;

a second electrically insulating member disposed on said first shield member; and a second shield member disposed on said second insulating member and extending downwardly from a point above a bottom portion of said target and spaced from said target and said chamber wall.

13. The PVD reactor of claim 12, wherein said second shield member comprises a metal.

14. The PVD reactor of claim 13, wherein said second shield member is electrically floating.

15. The reactor of claim 13, wherein said second shield member overlaps a radially inward portion of said first shield member so as to shield said second insulating member from particles sputtered from said target.

16. The reactor of claim 13, wherein said second shield member is interposed between said target and said first insulating member.

17. The reactor of claim 13, wherein said first shield member rests on and is electrically connected to said chamber wall.

18. A PVD reactor, comprising:
- a metal chamber wall having an inwardly extending ledge;
- a first shield member having a rim portion resting on said ledge and a skirt portion extending in a first direction substantially parallel to said chamber wall;
- a first electrically insulating member resting on said first shield member;
- a sputtering target assembly including a sputtering target;
- a second electrically insulating member supporting said target assembly on said chamber wall; and
- a second shield member resting on said first insulating member, separated from said chamber wall, and interposed between said target and said second electrically insulating member.

19. The PVD reactor of claim 18, wherein said second shield member has a lip extending in said first direction radially inwardly of all of said first insulating member.

20. The PVD reactor of claim 18, wherein said second shield member is electrically floating.

* * * * *